(12) United States Patent
Kim

(10) Patent No.: US 11,343,917 B2
(45) Date of Patent: May 24, 2022

(54) AIR CONDITIONER

(71) Applicant: Samsung Electronics Co., Ltd., Suwon-si (KR)

(72) Inventor: Yong Hoon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/961,648

(22) PCT Filed: Jan. 9, 2019

(86) PCT No.: PCT/KR2019/000322
§ 371 (c)(1),
(2) Date: Jul. 10, 2020

(87) PCT Pub. No.: WO2019/139343
PCT Pub. Date: Jul. 18, 2019

(65) Prior Publication Data
US 2020/0344883 A1    Oct. 29, 2020

(30) Foreign Application Priority Data
Jan. 10, 2018 (KR) ........................ 10-2018-0003251

(51) Int. Cl.
*H05K 1/18* (2006.01)
*H01F 17/06* (2006.01)
(Continued)

(52) U.S. Cl.
CPC ............. *H05K 1/181* (2013.01); *H01F 17/06* (2013.01); *H01F 27/2823* (2013.01);
(Continued)

(58) Field of Classification Search
CPC ...................................................... H05K 1/181
(Continued)

(56) References Cited

U.S. PATENT DOCUMENTS

2008/0197959 A1\* 8/2008 Buckmeier .......... H01R 13/719
336/107
2017/0301968 A1\* 10/2017 Cooney .................... C09D 5/00
(Continued)

FOREIGN PATENT DOCUMENTS

| JP | H11-087150 A | 3/1999 |
| JP | 2002-217046 A | 8/2002 |

(Continued)

OTHER PUBLICATIONS

International Search Report dated Apr. 24, 2019 in connection with International Patent Application No. PCT/KR2019/000322, 2 pages.
(Continued)

*Primary Examiner* — Stanley Tso

(57) ABSTRACT

Provided is an air conditioner capable of preventing a soldering defect when a circuit element is installed on a circuit board. The air conditioner includes a circuit board configured to form a circuit, a choke coil installed on the circuit board and having a wire wound around on a core, and a support device installed at a lower side of the choke coil to support the choke coil, and provided with a through-hole allowing the wire to pass therethrough, wherein the support device includes a support portion that protrudes from a lower surface of the support device to support the choke coil installed on the circuit board at an interval from the circuit board, the support portion disposed to be spaced apart from the through-hole in a direction away from an outer edge of the support device.

13 Claims, 8 Drawing Sheets

(51) Int. Cl.
 *H01F 27/28* (2006.01)
 *H05K 1/11* (2006.01)
 *H01F 17/00* (2006.01)
(52) U.S. Cl.
 CPC ...... *H05K 1/115* (2013.01); *H01F 2017/0093* (2013.01); *H05K 2201/012* (2013.01); *H05K 2201/1003* (2013.01)
(58) Field of Classification Search
 USPC .......................................................... 361/782
 See application file for complete search history.

(56) References Cited

U.S. PATENT DOCUMENTS

2019/0090356 A1* 3/2019 Bukkems ............. H05K 3/0058
2019/0311845 A1* 10/2019 Imanishi ............... H01F 27/085

FOREIGN PATENT DOCUMENTS

| | | | |
|---|---|---|---|
| JP | 2002-359119 | A | 12/2002 |
| JP | 2002359119 | A * | 12/2002 |
| JP | 2010-165795 | A | 7/2010 |
| JP | 2010165795 | A * | 7/2010 |
| JP | 2017-228606 | A | 12/2017 |

OTHER PUBLICATIONS

Written Opinion of the International Searching Authority dated Apr. 24, 2019 in connection with International Patent Application No. PCT/KR2019/000322, 5 pages.

* cited by examiner

AIR CONDITIONER

CROSS-REFERENCE TO RELATED APPLICATIONS

This application is a 371 of International Application No. PCT/KR2019/000322 filed on Jan. 9, 2019, which claims priority to Korean Patent Application No. 10-2018-0003251 filed on Jan. 10, 2018, the disclosures of which are herein incorporated by reference in their entirety.

BACKGROUND

1. Field

The disclosure relates to an air conditioner including a choke coil as a circuit element constituting an internal electronic circuit.

2. Description of Related Art

In general, an air conditioner is an appliance which controls temperature, humidity, and air current distribution of an indoor space and also eliminates dust from air by using a refrigeration cycle in order to provide a comfortable indoor environment for users. The refrigeration cycle includes a compressor, a condenser, an evaporator, and a blower fan as main components.

In order to supply power required for each component constituting the refrigeration cycle, or to improve noise and electromagnetic interference characteristics or obtain a required inductance in configuration of a control circuit, a toroidal type choke coil may be used as a circuit element.

The toroidal type choke coil has a lead wire portion installed on a circuit board by soldering, and when a base portion of the choke coil comes into close contact with the circuit board, gas generated in the soldering process is not easily discharged to the outside, forming a pin hole at a contact point between the lead wire and the circuit board, that is, a soldering defect, and such a soldering state is not easily checked from the outside.

One aspect of the disclosure provides an air conditioner in which a soldering defect is prevented in a process of installing a circuit element on a circuit board.

Another aspect of the disclosure provides an air conditioner enabling a soldering state to be checked after a choke coil is installed on a circuit board.

Another aspect of the disclosure provides an air conditioner having a choke coil in which damage to a support device portion is prevented in a process of aligning a coil.

SUMMARY

According to an aspect of the disclosure, there is provided an air conditioner including: a circuit board configured to form a circuit; a choke coil installed on the circuit board and having a wire wound around on a core; a support device installed at a lower side of the choke coil to support the choke coil, and provided with a through-hole allowing the wire to pass therethrough, wherein the support device includes a support portion that protrudes from a lower surface of the support device to support the choke coil installed on the circuit board at an interval from the circuit board, the support portion disposed to be spaced apart from the through-hole in a direction away from an outer edge of the support device.

The support portion may be disposed to be spaced apart from a longitudinal edge of the support device.

The support portion may include a plurality of lateral support portions arranged along a lengthwise direction of the support device and a plurality of longitudinal support portions arranged along a widthwise direction of the support device.

The support portion may be formed by connecting the plurality of lateral support portions to the plurality of longitudinal support portions.

The through-hole may be provided as a long hole allowing a plurality of the wires to pass therethrough.

At least one of the plurality of lateral support portions may be arranged to face a long axis of the through-hole, and at least one of the plurality of longitudinal support portions may be arranged to face a short axis of the through hole.

The wire may include two strands.

The support device may include a reinforcement portion on an upper surface thereof to reinforce strength of the support device.

The reinforcement portion may include a hole reinforcement portion protruding along a periphery of the through-hole on the upper surface of the support device.

The reinforcement portion may include an outer edge reinforcement portion protruding along an outer edge of the support device on the upper surface of the support device.

The support device may have a thickness of 4 mm to 7 mm in a region having the reinforcement portion.

The support portion may protrude from the lower surface of the support device by 2.5 mm to 2.9 mm.

The support device may include a resin having a flame resistance at a temperature of at least 800° C.

According to another aspect of the disclosure, there is provided an air conditioner including: a choke coil having a plurality of wires wound around on a core; and a support device provided with a through-hole formed as a long hole that allows the plurality of wires to pass therethrough, wherein the support device includes a support portion protruding from a lower surface of the support device and arranged in an inner region of the lower surface of the support device while being disposed to be spaced apart from the through-hole in a shape corresponding to a shape of the through hole.

For a case in which an object approaches an end portion of the wire having passed through the through-hole to position-align the end portion of the wire, an area between outer edges of the support device adjacent to the through-hole may be provided as an open area in which the support portion is not arranged so that interference is prevented.

The support portion may include a lateral support portion arranged to face a short axis of the through hole and a longitudinal support portion arranged to face a long axis of the through hole.

The support device may further include a reinforcement portion on the upper surface thereof to reinforce the strength of the support device.

According to another aspect of the disclosure, there is provided a circuit board including; a choke coil installed on the circuit board and having a wire wound around on a core; and a support device installed at a lower side of the choke coil to support the choke coil, and provided with a through-hole allowing the wire to pass therethrough, wherein the support device includes: a support portion that protrudes from a lower surface of the support device to support the choke coil 1 installed on the circuit board at an interval from the circuit board; and a reinforcement portion provided on an upper surface of the support device to reinforce strength of the support device.

The support portion and the reinforcement portion may be arranged without overlapping one on top of another.

For a case in which an object approaches an end portion of the wire having passed through the through-hole to position-align the end portion of the wire, an area between outer edges of the support device adjacent to the through-hole may be provided as an open area in which the support portion is not arranged so that interference is prevented.

The wire may include two strands and MAY BE wound on the core, and the circuit board may further include an installation hole that is a long hole allowing the wire including the two strands to pass therethrough.

The reinforcement portion may include: a hole reinforcement portion protruding along a periphery of the through-hole on the upper surface of the support device; and an outer edge reinforcement portion protruding along an outer edge of the support device on the upper surface of the support device.

Advantageous Effects

As is apparent from the above, a soldering defect is prevented when a circuit element is installed on a circuit board, and a soldering state is checked after a choke coil is installed on the circuit board, so that the reliability of the air conditioner can be improved.

In addition, damage to a support device portion can be prevented in a process of aligning a lead.

DETAILED DESCRIPTION

Figure 1:
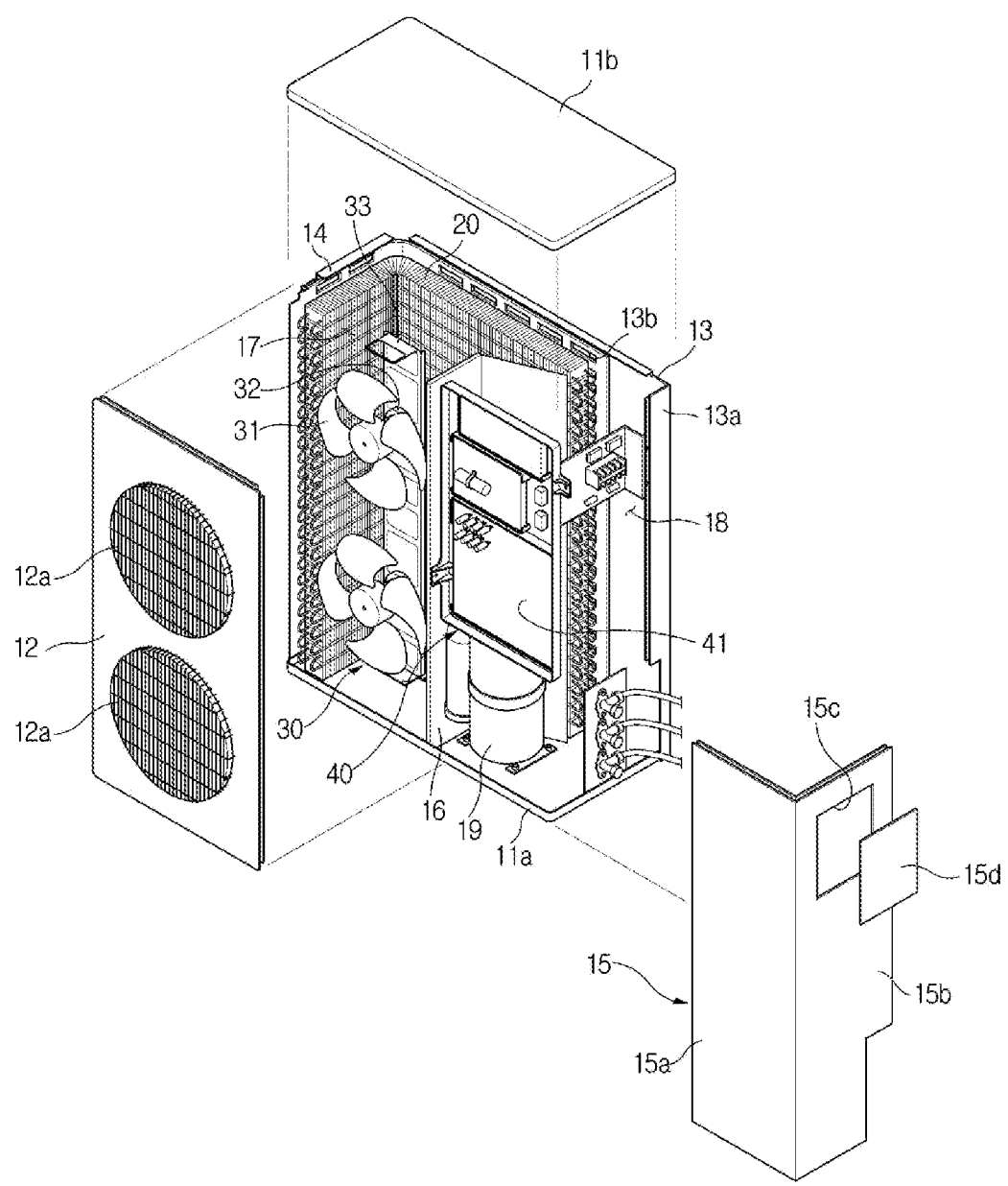
FIG. 1 is an exploded perspective view illustrating an air conditioner according to an embodiment of the disclosure.
Figure 2:
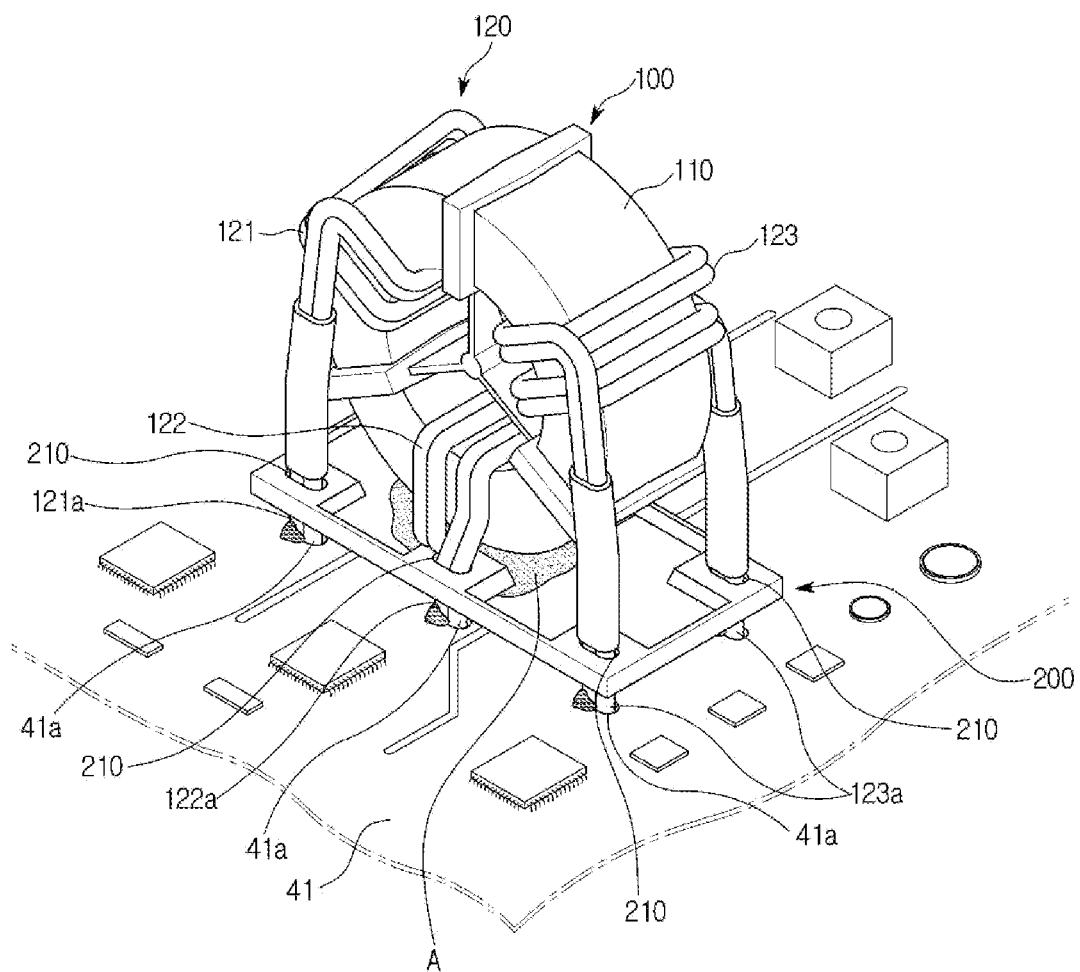
FIG. 2 is a perspective view illustrating a state in which a choke coil is installed in the air conditioner according to the embodiment of the disclosure.
Figure 3:
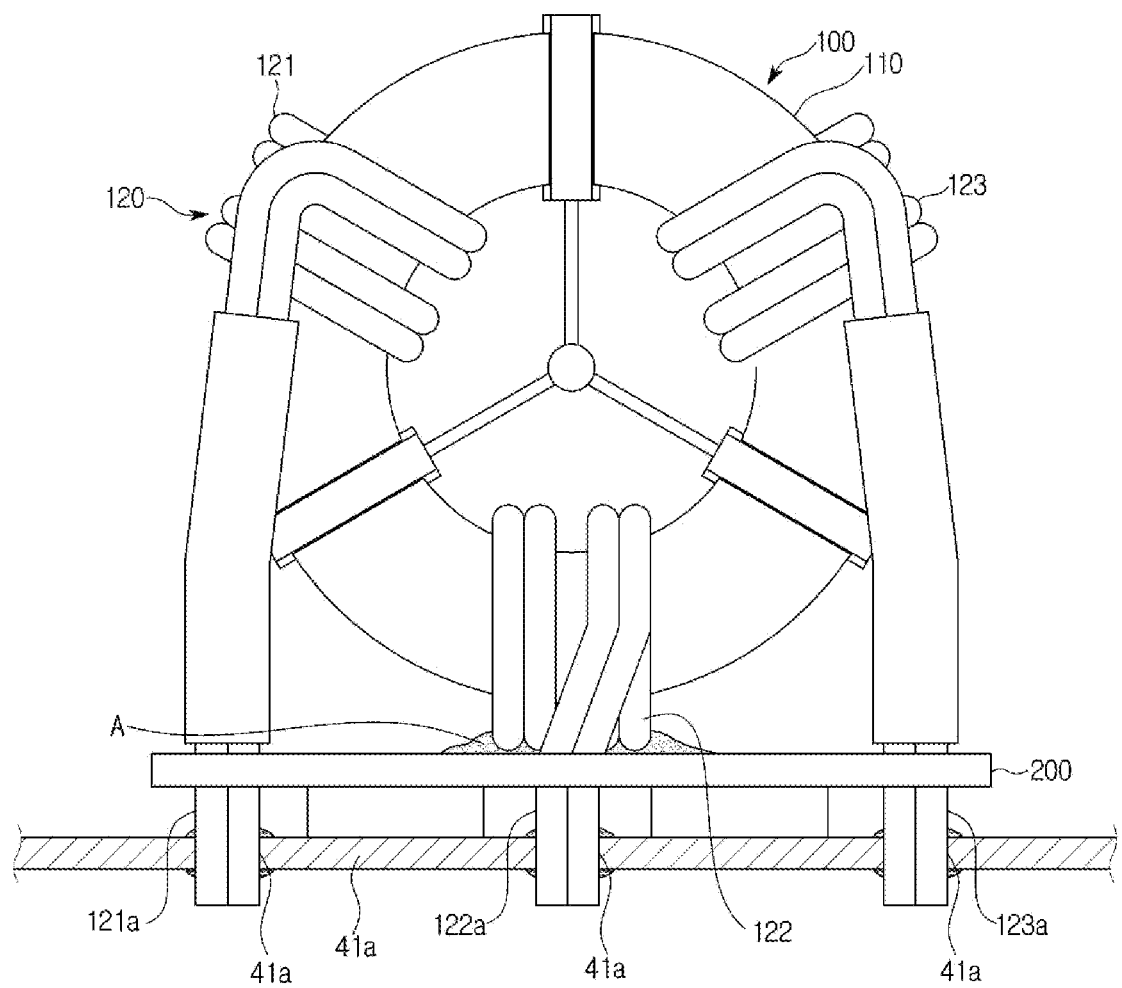
FIG. 3 is a front view illustrating a state in which the choke coil is installed in the air conditioner according to an embodiment of the disclosure.

A wire 120 may be composed of three loops 121, 122, and 123 to correspond to three-phase alternating current, and thus the wire 120 may include six leads 121a, 122a, and 123a.

As an air conditioner 10 is provided in a large size, input/output current also increases, and the maximum current specification required for components increases. Therefore, according to the embodiment of the disclosure, the wire 120 constituting each of the loops 121, 122, and 123 may be composed of two strands in parallel. When the wire 120 is composed of a single strand and is provided with a large diameter to cope with large current, the wire 120 is not easily wound around core 110. Accordingly, the wire 120 is composed of two strands with a diameter suitable for being wound around the core 110 to form the choke coil 100. For example, in the case of a choke coil having a rated allowable current of 50 A, the coil may be formed of a wire of two strands having a diameter of 2.8 mm.

The choke coil 100 is installed on a circuit board 51 by performing soldering on lower portions of installation holes 41a of the circuit board 41 in a state in which the leads 121a, 122a, and 123a inserted into the installation holes 41a pass through the installation holes 41a such that lead solder is filled between the installation holes 41a and the leads 121a, 122a, and 123a. The installation hole 41a is provided as a long hole such that the leads 121a, 122a, and 123a, each of which is composed of two strands are inserted into the installation hole 41a.

A support device 200 may be disposed between the choke coil 100 and the circuit board 41. An adhesive A, such as a hot melt, may be bonded between the choke coil 100 and the support device 200.

The support device 200 supports the leads 121a, 122a, and 123a of the choke coil 100 to be kept at the right angle with respect to the circuit board 41 when the leads 121a, 122a, and 123a are inserted into the installation holes 41a such that the leads 121a, 122a, and 123a are smoothly inserted into the installation holes 41a.

In addition, the support device 200 may support the choke coil 100 to be spaced apart from the circuit board 41 by a predetermined interval. The support device 200 may include through-holes 210 through which the leads 121a, 122a, and 123a may pass. The through-holes 210 may be provided at positions where the leads 121a, 122a, and 123a may pass through the through-holes 210 in the vertical direction, and may be provided in the total of six units thereof along an outer edge of the support device 200. The through-hole 210 may be provided as a long hole such that the leads 121a, 122a, and 123a each composed of two strands may smoothly pass through the through-holes 210. The long hole has a long axis and a short axis, such as in an ellipse, which are parallel to the lengthwise direction of the support device 200 and the widthwise direction of the support device 200, respectively.

The support device 200 may include a reinforcement portion 220 that reinforces the strength of the support device 200. The reinforcement portion 220 may reinforce the strength of the support device 200 to prevent the support device 200 from being broken by a force applied to the leads 121a, 122a, and 123a in a process of aligning the leads 121a, 122a, and 123a, which will be described below. The reinforcement portion 220 may be provided as a structure protruding from an upper surface 201 of the support device 200, and may include a hole reinforcement portion 221 protruding along a periphery of the through-hole 210 and an outer edge reinforcement portion 22 protruding along the outer edge of the support device 200. The hole reinforcement portion 221 may mainly reinforce the strength of the periphery of the through-hole 210, and the outer edge reinforcement portion 222 may mainly reinforce the strength of the periphery of the outer edge of the support device 200.

When the reinforcement portion 220 has a great thickness, the strengthening effect of the support device 200 is more ensured, but the amount of material for forming the reinforcing portion 230 increases. Accordingly, the reinforcement portion 220 may be formed to have a thickness of 4 mm to 7 mm.

The support device 200 may include a support portion 230 provided on a lower surface 202 thereof. The support portion 230 may be provided to protrude a predetermined height downward from the lower surface 202. The support portion 230 supports the choke coil 100 to be spaced apart from the circuit board 41 at a predetermined interval in a state in which the choke coil 100 is installed on the circuit board 41. As the choke coil 100 is spaced apart from the circuit board 41, gas generated from the installation hole 41a due to high temperature heat in the process of soldering the choke coil 100 is smoothly discharged to the outside of the installation hole 41a. Such a configuration may prevent a soldering defect that may be caused when the choke coil 100 and the circuit board 41 are in close contact with each other so that the installation hole 41a is blocked by the choke coil 100 or other structures, in which gas is ejected downward due to difficulty being ejected upward, and thus melted lead is not completely filled up inside of the installation hole 41a. In addition, when the choke coil 100 and the circuit board 41 are spaced apart from each other by the support portion 230, it may be checked whether the lead is sufficiently filled up to an upper portion of the installation hole 41a after soldering, and accordingly, it may be easily determined whether the soldering is normal or not.

The support portion 230 may be provided in various structures. According to an embodiment of the disclosure, the support portion 230 may be arranged to be spaced apart from the through-hole 210 in a direction away from the outer edge of the support device 200.

In another aspect, the support portion 230 is provided in a shape corresponding to the shape of the through-hole 210, and arranged in an inner region of the lower surface 202 of the support device 200 while being spaced apart from the periphery of the through-hole 210 by a predetermined distance.

In another aspect, an area between outer edges of the support device 200 adjacent to the through-hole 210 may be formed as an open area in which the support portion 230 is not disposed.

Figure 6:
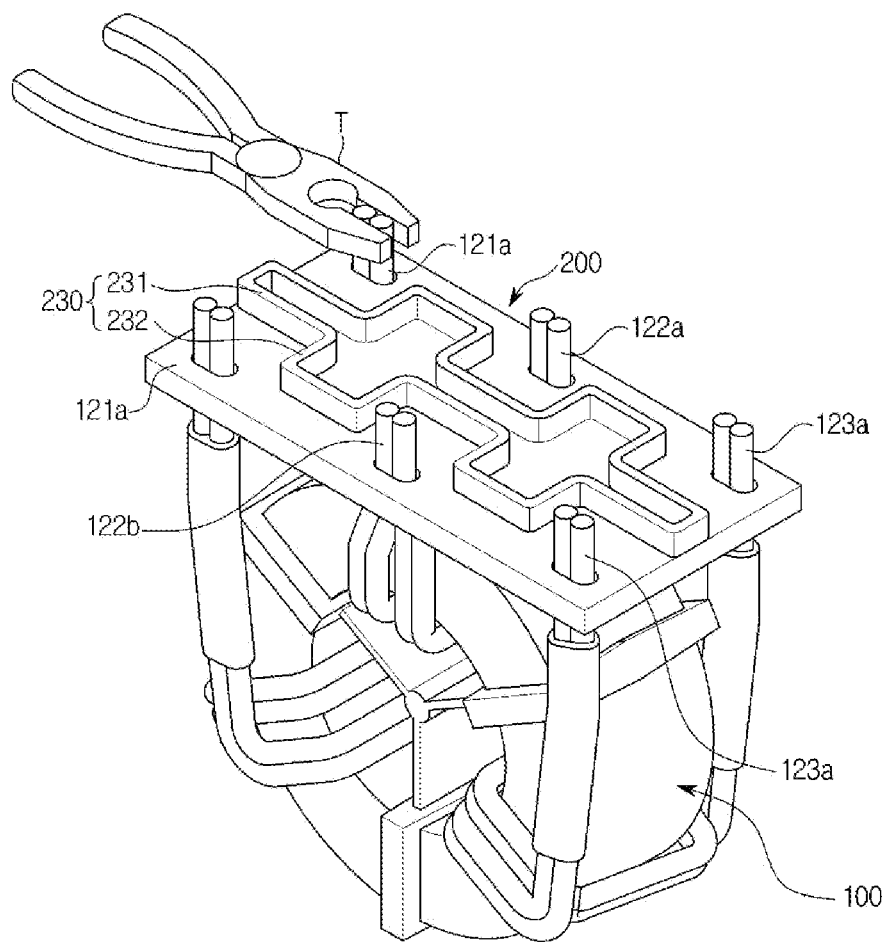
FIG. 6 is a view illustrating a process of aligning a lead by a tool after the choke coil is assembled to the support device.

Since the support portion 230 is arranged to be spaced apart from the through-hole 210, a space may be secured for a case in which an object, such as a tool T, approaches the leads 121a, 122a, and 123a to align the leads 121a, 122a, and 123a as shown in FIG. 6, such that the support portion 230 and the tool T do not interfere with each other. When the support portion 230 is formed in a shape corresponding to that of the through-hole 210, it is beneficial to secure the space for preventing the support portion 230 and the tool T from interfering with each other. The through-hole 210 may be formed as a long hole as described above, and when the support portion 230 is arranged to be spaced from the lengthwise edge of the support device 200 by a predetermined distance, it is beneficial to prevent interference between the tool T and the support portion 230 in a process of aligning the leads 121a, 122a, and 123a by a tool T for alignment of the leads 121a, 122a, and 123a to suit the shapes of the installation holes 41a, that is, the long holes.

In addition, the support portion 230 is formed in a shape corresponding to that of the through-hole 210, and the through-hole 210 is formed as a long hole with the long axis parallel to the lengthwise direction of the support device 200 and the short axis parallel to the widthwise direction of the support device 200.

Accordingly, the support portion 230 may be configured to include lateral support portions 231 arranged along the lengthwise direction of the support device 200 and longitudinal support portions 232 arranged along the widthwise direction of the support device 200.

According to the embodiment of the disclosure, the six leads 121a, 122a, and 123a and the six through-holes 210 may be provided on the lower portion of the support device 200, and in order to stably support the support device 200 while preventing interference with the tool T, the lateral support portion 231 and the longitudinal support portion 232 are provided in plural, and are arranged to surround the through-holes 210.

In addition, the lateral support portion 231 and the longitudinal support portion 232 are alternately arranged while being interconnected to each other to form one closed loop, forming one support portion 230.

When the lateral support portion 231 and the longitudinal support portion 232 are disposed as described above, the interference between the tool T and the support portion 230 is prevented, and the support device 200 is stably supported in the widthwise direction and the lengthwise direction.

The support portion 230 may protrude by a height in which the support device 200 and the choke coil 100 are stably supported while the choke coil 100 and the lower surface 202 of the support device 200 are sufficiently spaced apart from the circuit board 41. In consideration of this, the support portion 230 may be formed to protrude from the lower surface 202 of the support device 200 by 2.5 m to 2.9 mm, and may be formed to have the same height as a whole.

The support device 200 may be formed of a resin in consideration of insulation and processability, and may be manufactured by injection.

Meanwhile, as the choke coil 100 is supplied with power, heat is generated from the wire 120 and the temperature may increase to about 800° C. due to the influence of the current amount and ambient temperature. Therefore, in order to prevent the support device 200 from being deformed or fire from occurring by the temperature rise of the choke coil 100 during use, the support device 200 may be formed of a resin having a flame resistance at a temperature of at least about 800° C. One example of such a resin having flame resistance is a thermosetting resin.

Figure 7:
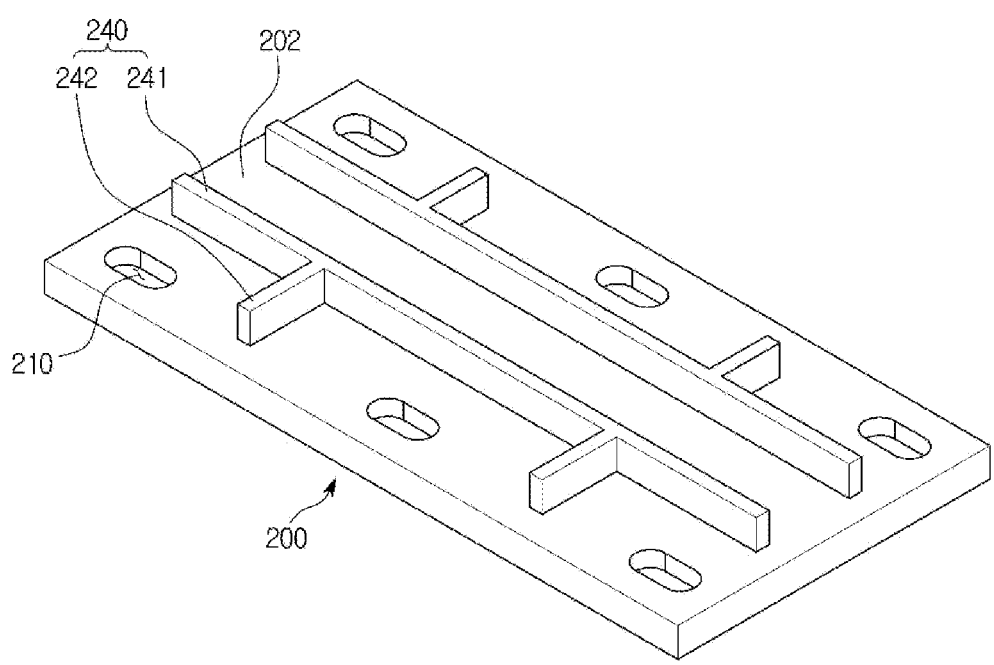
FIG. 7 is a view illustrating a support device according to another embodiment of the disclosure.

FIG. 7 is a view illustrating a support device according to another embodiment of the disclosure.

A support portion 240 may be spaced apart from the periphery of the through-hole 210 by a predetermined distance and may be arranged in an inner region of the lower surface 202 of the support device 200 in a shape corresponding to the shape of the through-hole 210, similar to that of the above embodiment. Therefore, since the support portion 240 is arranged to be spaced apart from the through-hole 210, a space is secured for a case in which an object, such as a tool T, approaches the leads (121a, 122a, and 123a in FIG. 6) to align the leads (121a, 122a, and 123a in FIG. 6), such that the support portion 240 and the tool T do not interfere with each other.

The support portion 240 may be configured to include a lateral support portions 241 extending along the lengthwise direction of the support device 200 and a longitudinal support portion 242 extending along the widthwise direction of the support device 200.

The lateral support portion 241 may be provided in a pair and arranged to be spaced apart in the width direction of the support device 200. The longitudinal support portion 242 may extend from the lateral support portion 241 and may be disposed between the through-holes 210 adjacent to each other so as to secure a space by which the support portion 240 and the tool T are prevented from interfering with each other.

When the support portion 240 is configured as described above, the space is secured such that the support portion 240 and the tool T are prevented from interfering with each other, and the amount of use of a material, such as resin, for forming the support portion 240 may be reduced.

Figure 4:
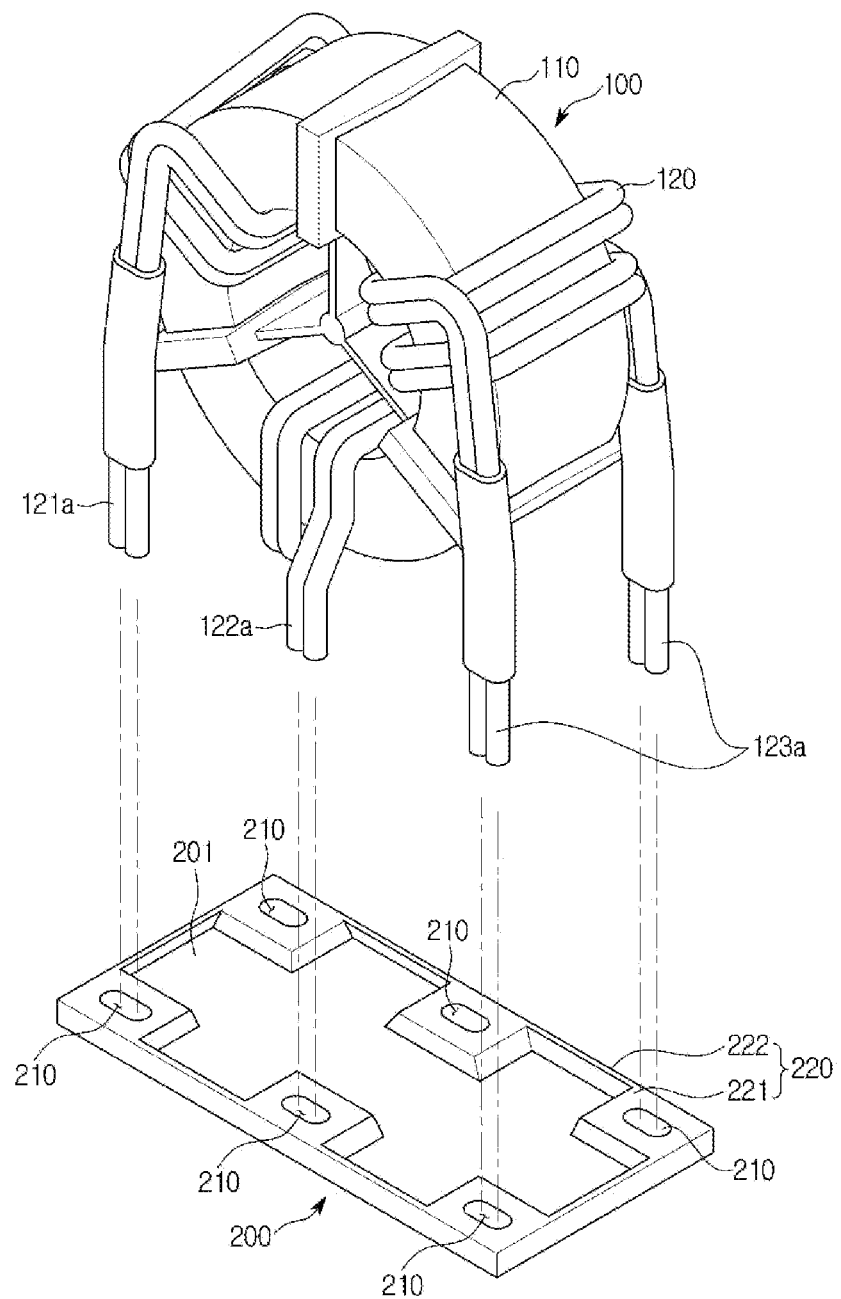
FIG. 4 is a view illustrating a state in which the choke coil of FIG. 2 is separated before being assembled to a support device.
Figure 5:
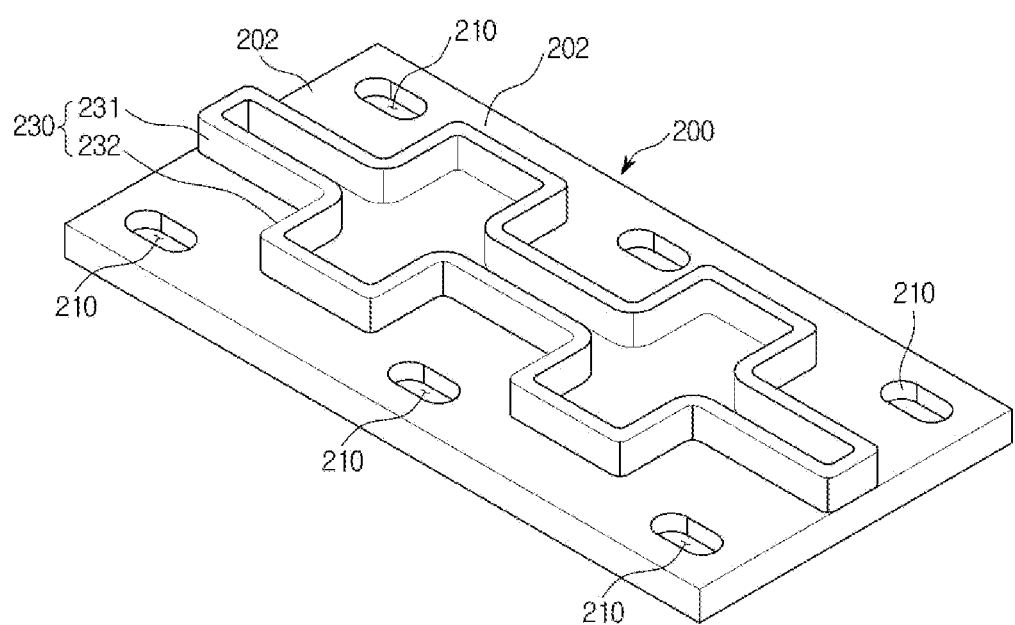
FIG. 5 is a view illustrating a lower surface of the support device.

The support portion 240 may also serve to reinforce the strength of the support device 200 together with the reinforcement portion (220 in FIG. 4). Therefore, when the support portion 240 is arranged without vertically overlapping the reinforcement portion 220 formed on the upper surface 201 of the support device 200, the strengthening effect may be maximized while reducing the amount of a resin used in the production of the support device 200.

Figure 8:
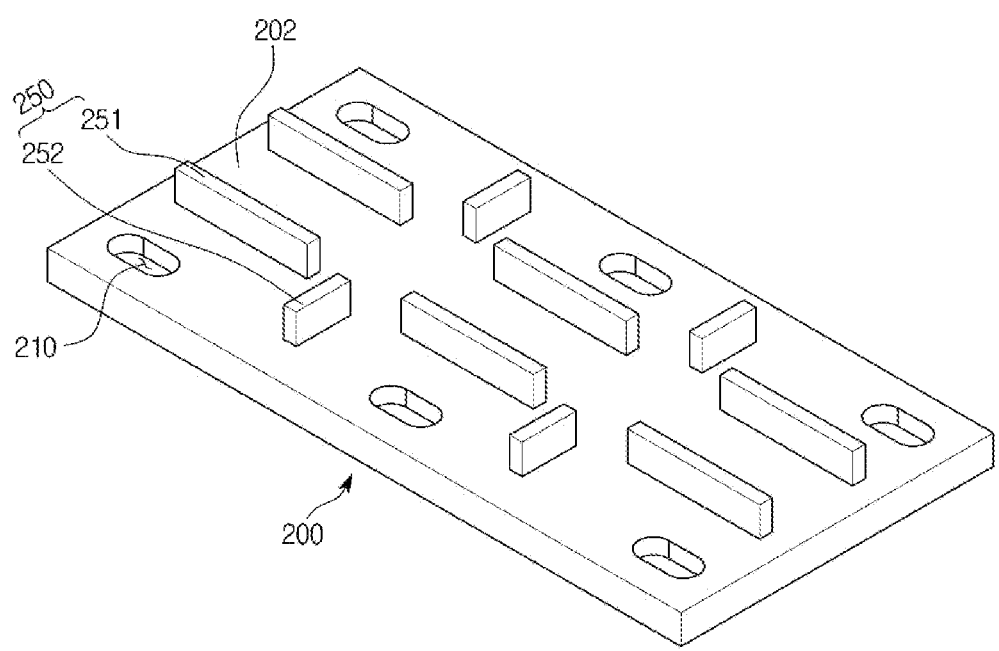
FIG. 8 is a view illustrating a support device according to another embodiment of the disclosure.

FIG. 8 is a view illustrating a support device according to another embodiment of the disclosure.

A support portion 250 may be spaced apart from the periphery of the through-hole 210 by a predetermined distance, and arranged in an inner region of the lower surface 202 of the support device 200 in a shape corresponding to the shape of the through-hole 210, similar to that of the previous embodiment. Therefore, since the support portion 250 is arranged to be spaced apart from the through-hole 210, a space is secured for a case in which an object, such as a tool T, approaches the leads (121a, 122a, and 123a in FIG. 6) to align the leads (121a, 122a, and 123a in FIG. 6) such that the support portion 250 and the tool T do not interfere with each other.

The support portion 250 may be configured to include a lateral support portion 251 extending along the lengthwise direction of the support device 200 and a longitudinal support portion 252 extending along the widthwise direction of the support device 200.

The lateral support portion 251 and the longitudinal support portion 252 may be disposed to be spaced apart from each other without being connected to each other.

When the support portion 250 is configured as described above, the space is secured such that the support portion 250 and the tool T are prevented from interfering with each other, and the amount of use of a material, such as resin, required for forming the support portion 250 may be further reduced.

In addition, the support portion 250 may also serve to reinforce the strength of the support device 200 together with the reinforcement portion (220 in FIG. 4). Therefore, when the support portion 250 is arranged without vertically overlapping the reinforcement portion 220 formed on the upper surface 201 of the support device 200, the strengthening effect may be maximized while reducing the amount of resin used in the production of the support device 200.

Although few embodiments of the disclosure have been shown and described, the above embodiment is illustrative purpose only, and it would be appreciated by those skilled in the art that changes and modifications may be made in these embodiments without departing from the principles and scope of the disclosure, the scope of which is defined in the claims and their equivalents.

The invention claimed is:

1. An air conditioner comprising:
a circuit board configured to form a circuit;
a choke coil installed on the circuit board and having a wire wound around on a core;
and a support device installed at a lower side of the choke coil to support the choke coil,
and provided with a through-hole allowing the wire to pass therethrough,
wherein the support device includes:
an outer edge having a rectangular shape; and
a support portion that protrudes from a lower surface of the support device to support the choke coil installed on the circuit board at an interval from the circuit board,
the support portion disposed to be spaced apart from a longitudinal edge of the outer edge,
wherein the support portion includes a lateral support portion extending parallel to and spaced from the longitudinal edge of the outer edge in a width direction of the support portion
and a longitudinal support portion extending parallel to a widthwise edge of the outer edge, and wherein the lateral support portion and the longitudinal support portion form a right angle that is inwardly spaced from the through hole.

2. The air conditioner of claim 1, wherein the lateral support portion and the longitudinal support portion are connected to each other.

3. The air conditioner of claim 1, wherein the through-hole is provided as a long hole allowing a plurality of wires to pass therethrough.

4. The air conditioner of claim 3, wherein the wire includes two strands.

5. The air conditioner of claim 1, wherein the support device includes a reinforcing portion on an upper surface thereof to reinforce strength of the support device.

6. The air conditioner of claim 5, wherein the reinforcement portion includes a hole reinforcement portion protruding along a periphery of the through-hole on the upper surface of the support device.

7. The air conditioner of claim 5, wherein the reinforcement portion includes an outer edge reinforcement portion protruding along the outer edge of the support device on the upper surface of the support device.

8. The air conditioner of claim 5, wherein the support device has a thickness of 4 mm to 7 mm in a region having the reinforcement portion.

9. The air conditioner of claim 1, wherein the support portion protrudes from the lower surface of the support device by 2.5 mm to 2.9 mm.

10. The air conditioner of claim 1, wherein the support device includes a resin having a flame resistance at a temperature of at least 800° C.

11. A circuit board for form a circuit, the circuit board comprising;
a choke coil installed on the circuit board and having a wire wound around on a core;
and a support device installed at a lower side of the choke coil to support the choke coil,
and provided with a through-hole allowing the wire to pass therethrough,
wherein the support device includes:
an outer edge having a rectangular shape;
and a support portion that protrudes from a lower surface of the support device to support the choke coil installed on the circuit board at an interval from the circuit board;
and a reinforcement portion provided on an upper surface of the support device to reinforce strength of the support device,
wherein the support portion is disposed to be spaced apart from a longitudinal edge of the outer edge,
wherein the support portion includes a lateral support portion extending parallel to and spaced from the longitudinal edge of the outer edge in a width direction of the support portion and a longitudinal support portion extending parallel to a widthwise edge of the outer edge, and wherein the lateral support portion and the longitudinal support portion form a right angle that is inwardly spaced from the through hole.

12. The circuit board of claim 11, wherein the support portion and the reinforcement portion are arranged without overlapping one on top of another.

13. The circuit board of claim 11, wherein the wire includes two strands and is wound on the core, and
further comprising an installation hole that is a long hole allowing the wire including the two strands to pass therethrough.

* * * * *